US009093642B2

(12) United States Patent
Okajima

(10) Patent No.: US 9,093,642 B2
(45) Date of Patent: Jul. 28, 2015

(54) NON-VOLATILE MEMORY DEVICE AND METHOD OF MANUFACTURING THE SAME

(71) Applicant: KABUSHIKI KAISHA TOSHIBA, Minato-ku (JP)

(72) Inventor: Mutsumi Okajima, Mie (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 13/945,342

(22) Filed: Jul. 18, 2013

(65) Prior Publication Data

US 2014/0209849 A1  Jul. 31, 2014

Related U.S. Application Data

(60) Provisional application No. 61/756,797, filed on Jan. 25, 2013.

(30) Foreign Application Priority Data

Mar. 8, 2013 (JP) ................................. 2013-046924

(51) Int. Cl.
*H01L 45/00* (2006.01)
*H01L 27/24* (2006.01)
*G11C 13/00* (2006.01)

(52) U.S. Cl.
CPC ........ *H01L 45/1675* (2013.01); *H01L 27/2409* (2013.01); *H01L 27/2463* (2013.01); *G11C 13/0002* (2013.01); *H01L 45/04* (2013.01); *H01L 45/06* (2013.01); *H01L 45/1233* (2013.01); *H01L 45/145* (2013.01); *H01L 45/146* (2013.01); *H01L 45/149* (2013.01)

(58) Field of Classification Search
CPC ..... H01L 45/04; H01L 45/1233; H01L 45/14; H01L 45/145; H01L 45/146; H01L 45/147; H01L 45/16; H01L 45/1608; H01L 45/1666; H01L 45/1675; H01L 21/768
USPC .................. 438/104, 618, 622, 648–651, 926
See application file for complete search history.

(56) References Cited

U.S. PATENT DOCUMENTS

| | | | |
|---|---|---|---|
| 6,413,847 B1 * | 7/2002 | Yeh et al. ...................... | 438/598 |
| 6,924,183 B2 | 8/2005 | Mori | |
| 7,115,964 B2 | 10/2006 | Mori | |
| 7,700,997 B2 * | 4/2010 | Futatsuyama et al. ........ | 257/326 |
| 7,701,742 B2 * | 4/2010 | Sakuma et al. ................. | 365/51 |
| 8,183,602 B2 | 5/2012 | Tabata et al. | |
| 8,339,859 B2 * | 12/2012 | Park et al. ................ | 365/185.17 |

(Continued)

FOREIGN PATENT DOCUMENTS

| | | |
|---|---|---|
| JP | 8-330250 | 12/1996 |
| JP | 2000-183043 | 6/2000 |

(Continued)

*Primary Examiner* — Fernando L Toledo
*Assistant Examiner* — Christine C Lau
(74) *Attorney, Agent, or Firm* — Oblon, McClelland, Maier & Neustadt, L.L.P.

(57) ABSTRACT

According to one embodiment, dry etching is performed so that an upper-layer wiring material layer, a memory-layer constituting layer, and an interlayer insulating film are processed to form a pattern including a line-and-space pattern extending in a second direction and a dummy pattern connecting line patterns constituting the line-and-space pattern in a memory cell formation region and an upper-layer wiring hookup region. Then, the dummy pattern is removed.

13 Claims, 17 Drawing Sheets

(56) References Cited

U.S. PATENT DOCUMENTS

| | | | |
|---|---|---|---|
| 8,437,170 B2* | 5/2013 | Fukano | 365/148 |
| 8,502,322 B2* | 8/2013 | Nitta | 257/390 |
| 8,753,973 B2* | 6/2014 | Furuhashi | 438/622 |
| 2010/0187591 A1* | 7/2010 | Nagashima | 257/314 |
| 2012/0205612 A1 | 8/2012 | Tabata et al. | |
| 2012/0244696 A1* | 9/2012 | Nagashima | 438/593 |

FOREIGN PATENT DOCUMENTS

| | | |
|---|---|---|
| JP | 2005-5577 | 1/2005 |
| JP | 2006-344773 | 12/2006 |
| JP | 2009-130140 | 6/2009 |

* cited by examiner

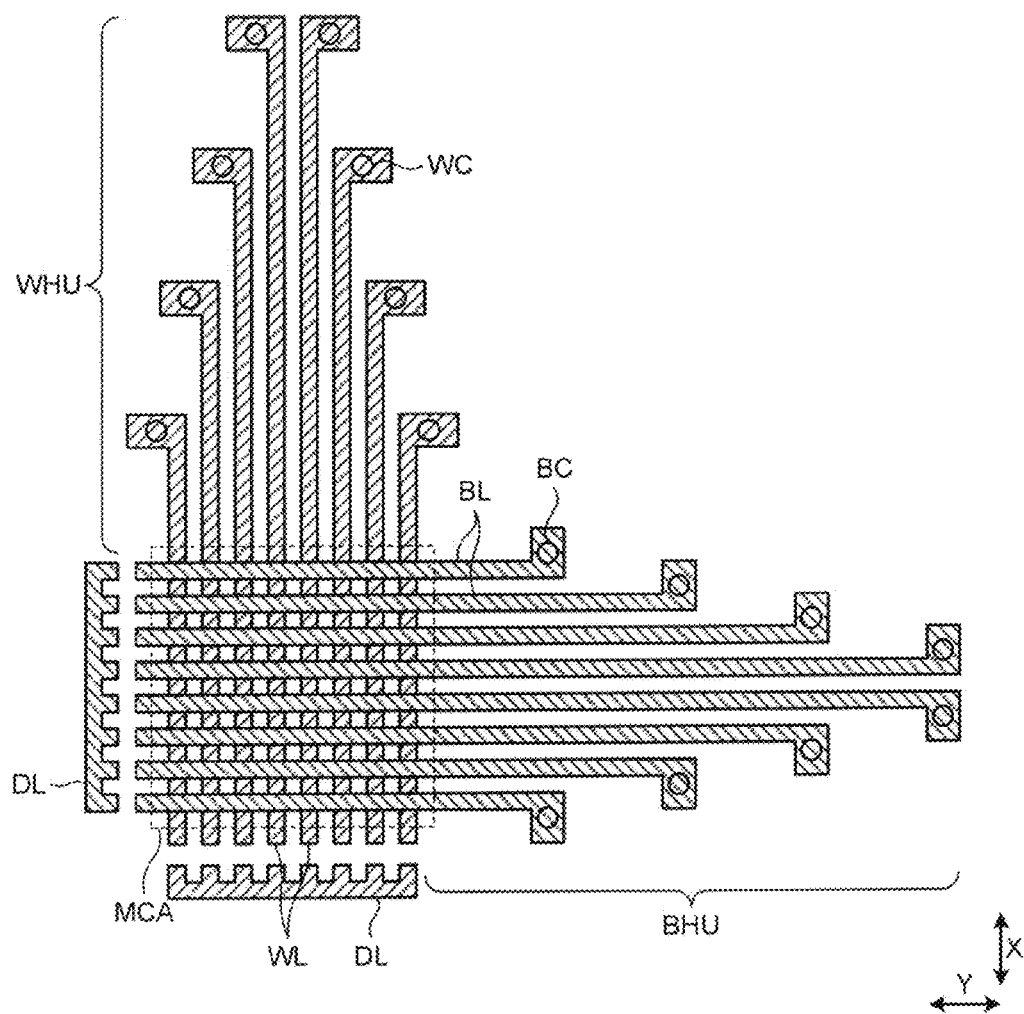

NON-VOLATILE MEMORY DEVICE AND METHOD OF MANUFACTURING THE SAME

CROSS-REFERENCE TO RELATED APPLICATIONS

This application is based upon and claims the benefit of priority from U.S. Provisional Application No. 61/756,797, filed on Jan. 25, 2013 and Japanese Patent Application No. 2013-046924, filed on Mar. 8, 2013; the entire contents of all of which are incorporated herein by reference.

FIELD

Embodiments described herein relate generally to a non-volatile memory device and a method of manufacturing the same.

BACKGROUND

In recent years, a ReRAM (Resistive Random Access Memory) which stores resistance value information, for a high resistance state and a low resistance state of an electrically rewritable variable resistive element in a non-volatile manner has drawn attention as a non-volatile memory device. In a memory cell array region of the ReRAM, for example, variable resistance memory cells in which includes variable resistive elements as memory elements and rectifying elements such as diode which is connected in series to the variable resistive elements are arranged at intersection portions of a plurality of word lines extending parallel to each other in a first direction and a plurality of bit lines extending parallel to each other in a second direction perpendicular to the first direction in an array shape. The word line and the bit line are extracted to a word line hookup region and a bit line hookup region, respectively, to be connected through contacts to different wiring layers.

In the word line hookup region and the bit line hookup region, contact connection portions for connecting the contacts to each of the word lines and each of the bit lines are formed so that the formation positions do not overlap between adjacent wirings. As a result, word line wiring lengths or bit line wiring lengths for matching the memory cell array region and the hookup regions are different between adjacent wirings. Therefore, in a stage of processing word lines or bit lines by using a dry etching process, a phenomenon occurs where charge-up amounts of wirings are different. Particularly, in a cross point type memory, after an upper-layer wiring is processed, a memory cell at an intersection point needs to be subsequently processed. However, in the state where the upper-layer wiring is processed, the charge-up amounts are different between the wirings. If an interlayer insulating film embedded between the memory cells is processed by dry etching in this state, there are problems in that dimensional defect occurs in the side etching of the upper-layer wiring caused by a curved trajectory of incident particles (ions, electrons) or in that falling and short-circuit of the upper-layer wiring occurs due to the side etching of the interlayer insulating film under the upper-layer wiring.

BRIEF DESCRIPTION OF THE DRAWINGS

FIG. 9 is a schematic top diagram illustrating another example of a configuration of a non-volatile memory device according to the embodiment.

DETAILED DESCRIPTION

Figure 1A:
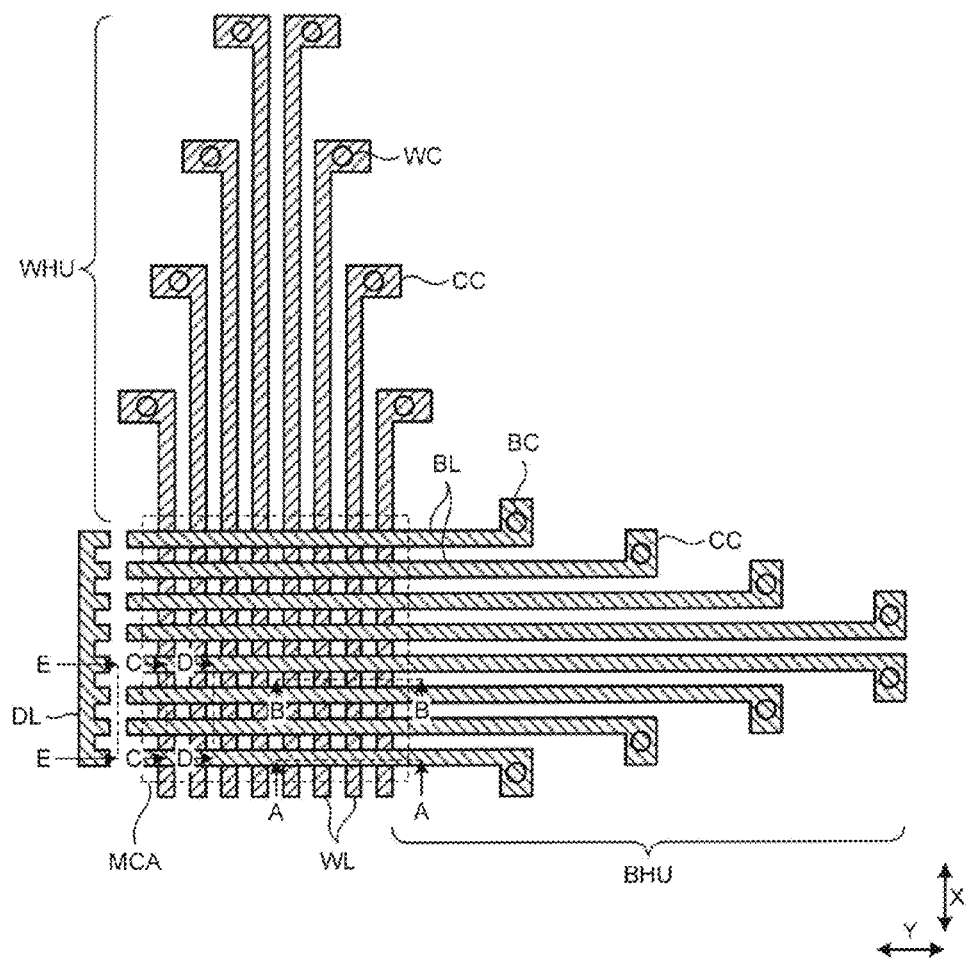
FIGS. 1A and 1B are schematic diagrams illustrating an example of a configuration of a variable resistance memory as a non-volatile memory device according to an embodiment.

In general, according to an embodiment, there is provided a method of manufacturing a non-volatile memory device including a plurality of first wirings extending in a first direction, a plurality of second wirings extending in a second direction intersecting the first direction, and a non-volatile memory cell array layer where a plurality of non-volatile memory cells are arranged at intersection portions between the first wirings and the second wirings so to be interposed. First, a first wiring material layer which is to be the first wiring and a memory-layer constituting layer constituting the non-volatile memory cell are sequentially stacked on a substrate. Next, dry etching is performed so that the memory-layer constituting layer and the first wiring material layer are etched to form a first pattern having a first line-and-space pattern extending in the first direction in a memory cell formation region and a first wiring hookup region adjacent in the first direction of the memory cell formation region and so that the memory-layer constituting layer and the first wiring material layer are removed in a second wiring hookup region adjacent in the second direction of the memory cell formation region. Next, an interlayer insulating film is formed to be embedded between line patterns constituting the first line-and-space pattern in the memory cell formation region and the first wiring hookup region, and an interlayer insulating film is formed in a region which is removed by the dry etching in the second wiring hookup region. Next, a second wiring material layer which is to be the second wiring is formed on the interlayer insulating film and the memory-layer constituting layer. Next, dry etching is performed so that the second wiring material layer, the memory-layer constituting layer, and the interlayer insulating film are processed to form a second pattern including a second line-and-space pattern extending in the second direction and a first dummy pattern connecting line patterns constituting the second line-and-space pattern in the memory cell formation region and the second wiring hookup region and so that the second wiring material layer and the memory-layer constituting layer are removed in the first wiring hookup region. Next, the first dummy pattern is removed.

Hereinafter, a non-volatile memory device and a method of manufacturing the same according to the embodiment will be described in detailed with reference to the attached drawings. The present invention is not limited to the embodiments. Cross-sectional diagrams of the non-volatile memory device used in the embodiment described hereinafter are illustrated schematically, and thus, a relationship between thickness and width of a layer, a ratio of thickness of layers, and the like may be different from actual relationships, ratios, and the like. In addition, in top diagrams of the non-volatile memory device used in the embodiment described hereinafter, hatching is used for easily identifying relationships between components. In addition, in the embodiment hereinafter, a variable resistance memory will be described as an example of a non-volatile memory device.

Figure 1B:
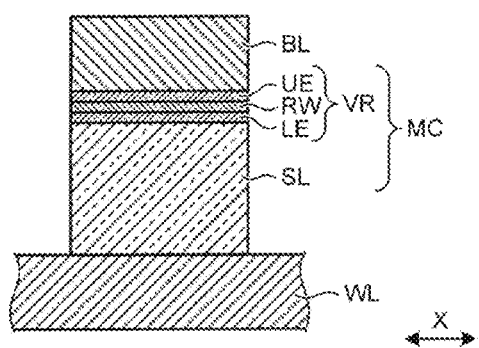
Figure 2A:
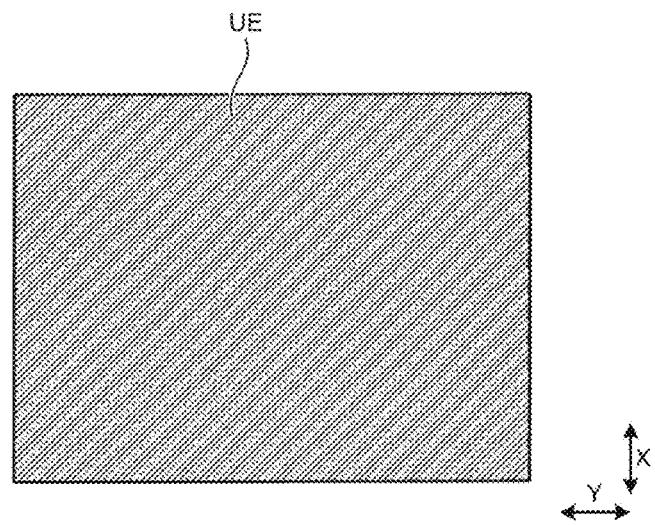
FIGS. 2A to 8F are schematic diagrams illustrating an example of a procedure of a method of manufacturing a variable resistance memory as a non-volatile memory device according to an embodiment.
Figure 2B:
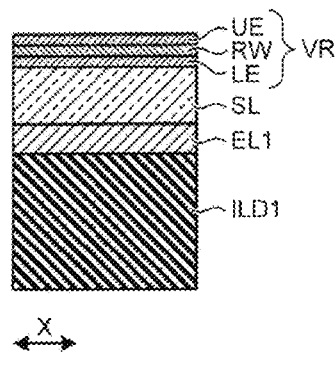
Figure 2C:
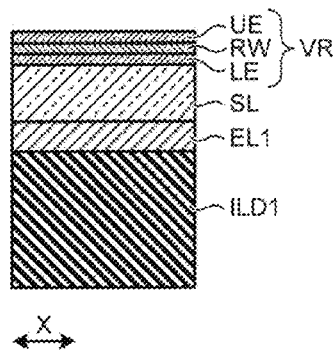
Figure 2D:
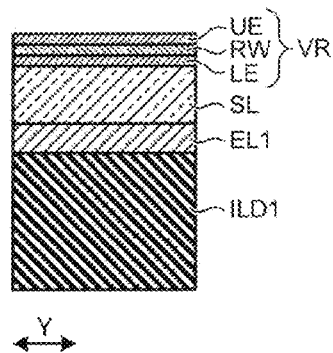
Figure 2E:
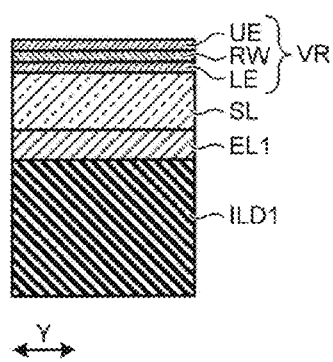
Figure 2F:
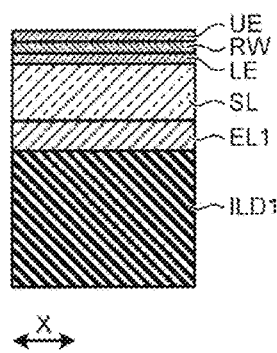
Figure 3A:
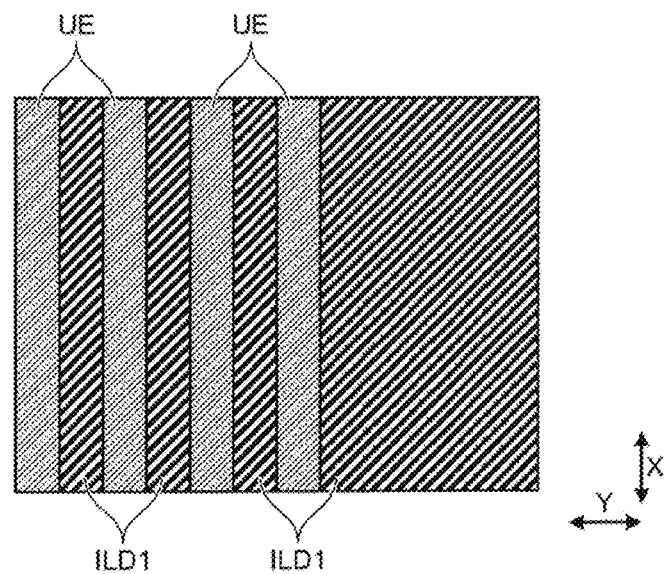
Figure 3B:
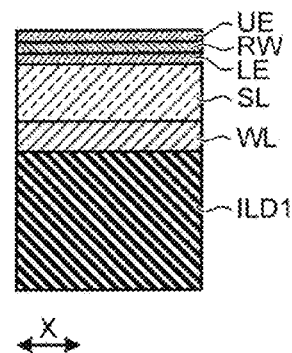
Figure 3C:
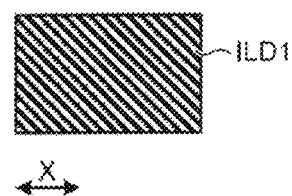
Figure 3D:
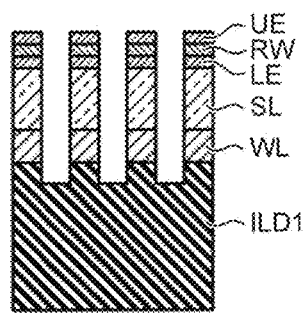
Figure 3E:
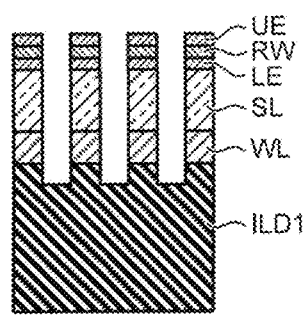
Figure 3F:
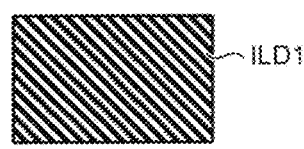
Figure 4A:
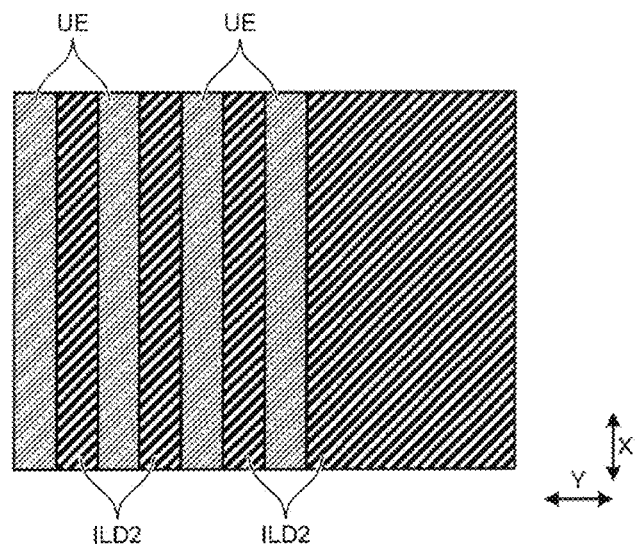
Figure 4B:
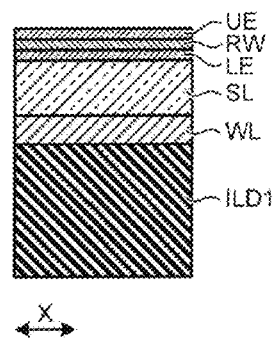
Figure 4C:
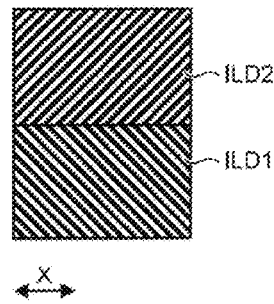
Figure 4D:
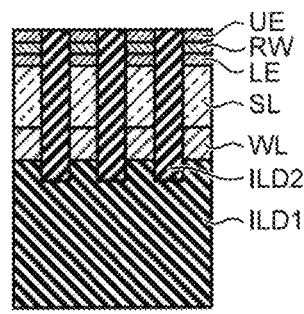
Figure 4E:
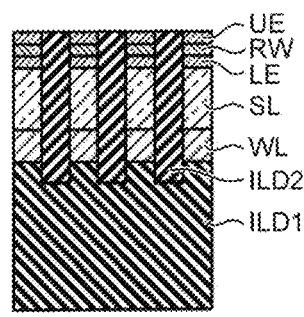
Figure 4F:
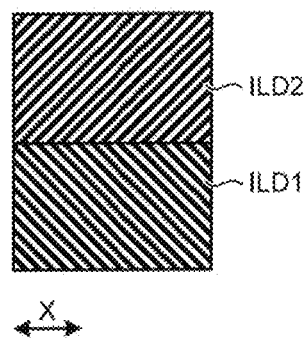
Figure 5A:
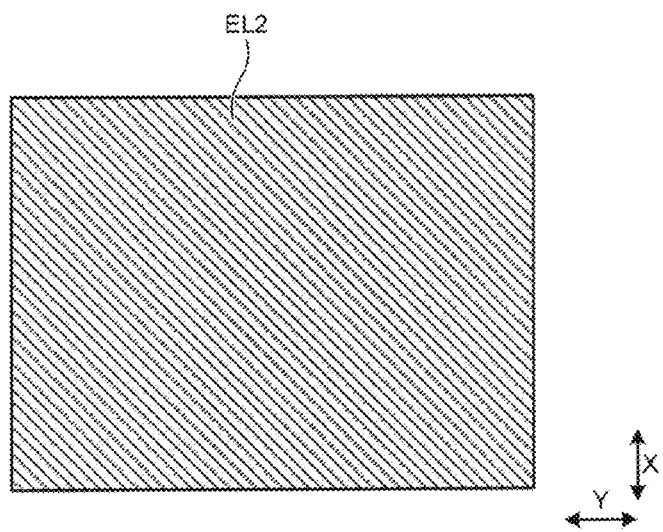
Figure 5B:
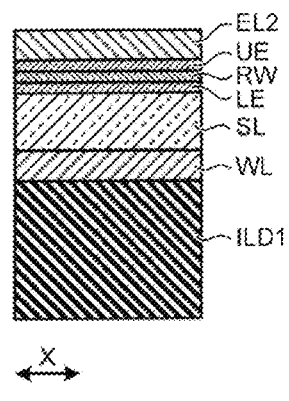
Figure 5C:
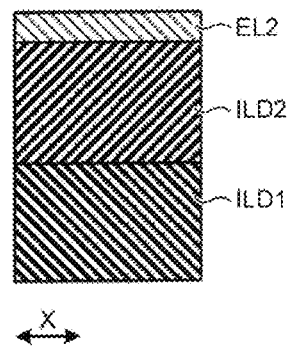
Figure 5D:
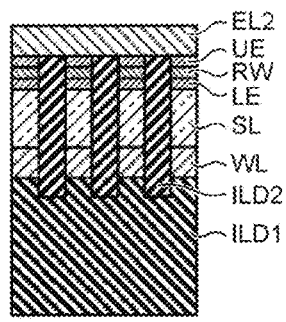
Figure 5E:
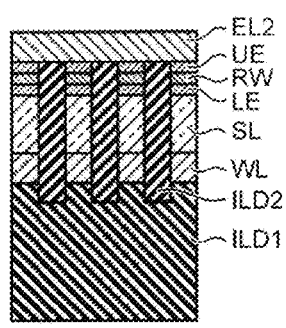
Figure 5F:
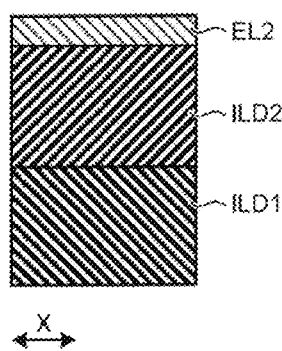

FIGS. 1A and 1B are schematic diagrams illustrating an example of a configuration of a variable resistance memory as a non-volatile memory device according to an embodiment. FIG. 1A is a top diagram illustrating the variable resistance memory according to the embodiment, and FIG. 1B is a cross-sectional diagram illustrating an example of a structure of a memory cell of the variable resistance memory. FIG. 1A illustrates wirings of a lower layer for the convenience, and FIG. 1B illustrates a cross-sectional structure on a word line along the word line.

The variable resistance memory includes a memory cell array unit MCA where, a plurality of word lines WL extending in an X direction and a plurality of bit lines BL extending in a Y direction having a height different from that of the word lines WL are arranged to intersect each other, and variable resistance memory cells (hereinafter, simply referred to as memory cells) MC where variable resistive elements VR and selector layers SL are connected in series are arranged in intersection portions of the word lines and the bit lines. In the one side of the memory cell array unit MCA in the X direction thereof, a word line hookup unit WHU is disposed so that word lines WL are extracted from the memory cell array unit MCA. In the one side of the memory cell array unit MCA in the Y direction thereof, a bit line hookup unit BHU is disposed so that the bit lines BL are extracted from the memory cell array unit MCA.

As illustrated in FIG. 1B, in the memory cell array unit MCA, a selector layer SL and a variable resistive element VR constituting a memory cell MC are stacked on the word line WL extending in the X direction, and the bit line BL extended in the Y direction is formed above the variable resistive element VR.

The selector layer SL is a layer for controlling a direction of a current flowing in the memory cell MC and is formed above the word line WL with a material having a rectification function of a Schottky barrier diode, a PN junction diode, a PIN diode, or the like. For example, the selector layer SL may be configured with a polycrystalline silicon film having a PIN junction.

The variable resistive element VR includes a lower electrode layer LE, a variable resistive layer RW as a non-volatile storage layer, and an upper electrode layer UE. The lower electrode layer LE and the upper electrode layer UE are configured with a metal material or a metal nitride material which does not affect variable resistance of the variable resistive layer RW in reaction with the variable resistive layer RW. As a lower electrode layer LE or an upper electrode layer UE, for example, at least one selected among metal materials of Pt, Au, Ag, Ru, Ir, Co, Al, Ti, W, Mo, Ta, and the like and a nitride of at least one selected among metal materials of Ti, W, Mo, Ta, and the like may be used. In some cases, the upper electrode layer UE or the lower electrode layer LE may not be provided.

The variable resistive layer RW is configured with a resistance change material such as a metal oxide, a carbon film, or the like of which the high resistance state and the low resistance state are switched according to a voltage value and an application time, a phase change memory material of which the resistance value is changed according to a change between crystalline and amorphous phases of a chalcogenide compound, or the like. As a resistance change material, for example, a metal oxide film including at least one or more elements among Si, Ti, Ta, Nb, Hf, Zr, W, Al, Ni, Co, Mn, Fe, Cu, Mo, and the like may be exemplified. In addition, in the case where the variable resistive layer RW is a material having a rectification characteristic, the selector layer SL may not be provided.

In the word line hookup unit WHU, the word lines WL are formed to extend from the memory cell array unit MCA. Among the word lines WL in a line-and-space shaped pattern, the lengths of the two word lines WL formed in the central portion in the Y direction are configured to longest, and the lengths of the word lines WL are configured to gradually shorten moving toward both ends in the Y direction. A contact connection portion CC is disposed at the end portion of each word line WL, and a word line contact WC is disposed at the contact connection portion CC. The word line contact WC is connected to a wiring of which the end portion is connected to a peripheral circuit.

In the bit line hookup unit BHU, the bit lines BL are formed to extend from the memory cell array unit MCA. Among the bit lines BL in a line-and-space shaped pattern, the lengths of the two bit lines BL formed in the central portion in the X direction are configured to be the longest, and the lengths of the bit lines BL are configured to gradually shorten moving toward both ends in the X direction. A contact connection portion CC is disposed at the end portion of each bit line BL, and a bit line contact BC is disposed at the contact connection portion CC. The bit line contact BC is connected to a wiring of which the end portion is connected to a peripheral circuit.

The adjacent memory cells MC, the adjacent word lines WL and the adjacent bit lines BL are insulated by an interlayer insulating film and the like.

In the embodiment, as illustrated in FIG. 1A, in the bit lines BL as an upper-layer wiring layer, dummy wirings DL are arranged in a region other than the region of the side of the bit line hookup unit BHU in the Y direction of the memory cell array unit MCA. The dummy wirings DL and the bit lines BL are not connected to each other, for example, to be separated by an interlayer insulating film. As described below, the dummy wiring DL has a function of equalizing the charge-up amounts of the upper-layer wirings processed in a line-and-space shape when a layer between the upper-layer wiring and the lower-layer wiring is processed in a line-and-space shape.

In the variable resistance memory having the above-described configuration, a voltage applied to the word line WL and the bit line BL is controlled so as to apply a predetermined voltage to the targeted memory cell MC, so that a resistance state of the variable resistive layer RW constituting the memory cell MC is changed. More specifically, a reset (erase) process for returning to a high resistance state where 1 to 2 digits of resistance is increased by Joule's heat is performed by flowing a current into the variable resistive layer RW in a low resistance state; or a set (write) process for returning to a low resistance state is performed by applying a voltage to the variable resistive layer RW in a high resistance state. In this manner, the high resistance state and the low resistance state are formed by the reset process and the set process to store resistance value information, and a difference of current in the memory cell MC is detected, so that the variable resistance memory can function as a memory.

Figure 6A:
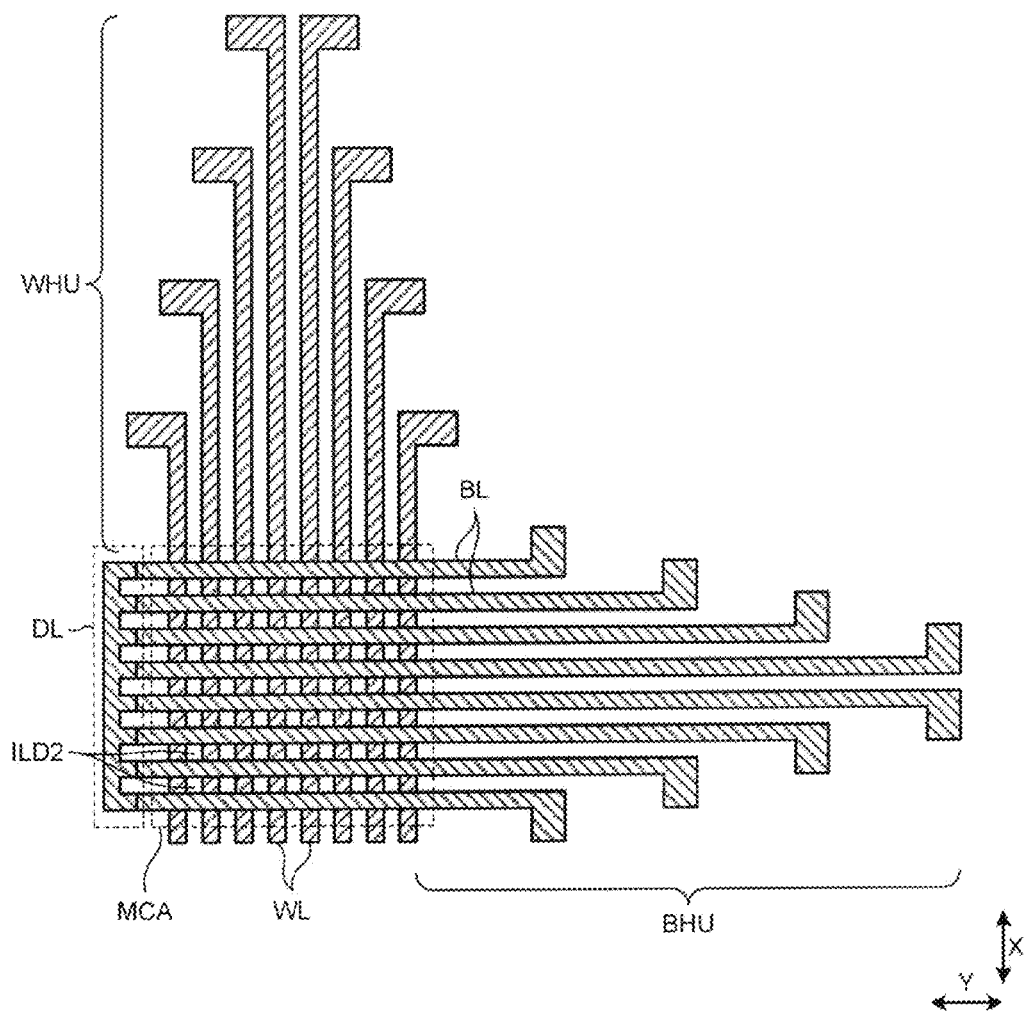
Figure 6B:
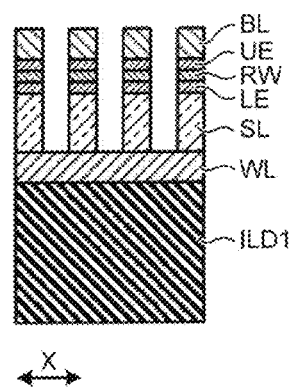
Figure 6C:
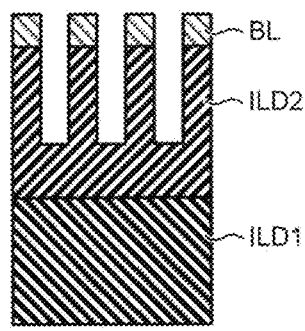
Figure 6D:
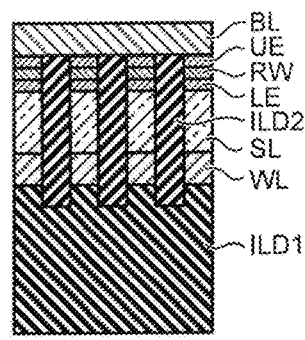
Figure 6E:
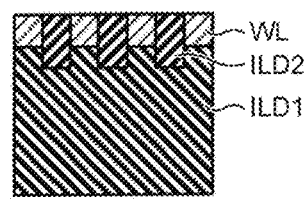
Figure 6F:
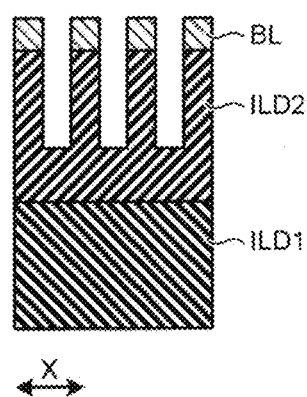

Next, a method of manufacturing the variable resistance memory having the above-described configuration will be described. FIGS. 2A to 8F are schematic diagrams illustrating an example of a procedure of a method of manufacturing the variable resistance memory as a non-volatile memory device according to the embodiment. Among the figures, FIGS. 2A to 8A are top diagrams; FIGS. 2B to 8B are cross-sectional diagrams on a word line WL along the word line WL and correspond to the cross section taken along line A-A of FIG. 1A; FIGS. 2C to 8C are cross-sectional diagrams of a portion where a word line WL does not exist along the word line WL and correspond to the cross section taken along line B-B of FIG. 1A; FIGS. 2D to 8D are cross-sectional diagrams on a bit lines BL along the bit lines BL and correspond to the cross section taken along line C-C of FIG. 1A; FIGS. 2E to 8E are cross-sectional diagrams of a portion where a bit line BL does not exist along the bit lines BL and correspond to the cross section taken along line D-D of FIG. 1A; and FIGS. 2F to 8F are diagrams corresponding to the cross section taken along line E-E of FIG. 1A. In addition, FIGS. 2A to 5A, 7A, and 8A illustrate top diagrams of the memory cell array unit; and FIG. 6A illustrates a top diagram of the memory cell array unit, the word line hookup unit, and the bit line hookup unit.

First, elements such as cell control transistor connected to the word lines WL and the bit lines BL of the memory cell MC and peripheral circuits (Complementary Metal-Oxide-Semiconductor (CMOS) Logic circuits, and the like) (not illustrated) including word line layers connected to the elements are formed on a semiconductor substrate (not illustrated), and an interlayer insulating film ILD1 is formed on the peripheral circuit. Next, as illustrated in FIGS. 2A to 2F, a film for configuring a memory cell array layer is stacked on the interlayer insulating film ILD1. In other words, a wiring material layer EL1, a selector layer SL, and a lower electrode layer LE, a variable resistive layer RW, and an upper electrode layer UE constituting a variable resistive element VR are sequentially stacked.

Next, as illustrated in FIGS. 3A to 3F, the upper electrode layer UE, the variable resistive layer RW, the lower electrode layer LE, the selector layer SL, and the wiring material layer EL1 are patterned in a line-and-space shape extending in the X direction by dry etching such as a reactive ion etching method by using a word line pattern mask on the upper electrode layer UE. Herein, the etching is performed until the bottom portion of the wiring material layer EL1 is cut off from the adjacent wiring material layer EL1 adjacent in the Y direction. Therefore, the wiring material layer EL1 becomes a word line WL, and the selector layer SL, the lower electrode layer LE, the variable resistive layer RW, and the upper electrode layer UE are formed in a pattern extending in the X direction similarly to the word line WL.

As illustrated in FIG. 1A, the word lines WL are formed over the memory cell array unit MCA and the word line hookup unit WHU. In the word line hookup unit WHU, the word lines WL are patterned so that the length of the word line WL disposed at the central portion in the Y direction of the word line hookup unit WHU is the longest, and the lengths of the word lines WL are shortened moving toward both ends of the Y direction of the word line hookup unit WHU. In addition, in the word line hookup unit WHU, the patterning is performed so that the end portion of the word line WL in the X direction is connected to the word line contact WC, and the word line contact WC is connected to the contact connection portion CC having a width larger than the width of the word line WL. Therefore, in a region other than the positions where the word lines WL are formed, the stacked film from the upper electrode layer UE to the wiring material layer EL1 is removed.

Herein, although the wiring material layer EL1 is charged up in the most central portion of the etching, a flat shape is maintained until the layer is cut as a word line WL, and electric charges are uniformly distributed. Therefore, the phenomenon where a trajectory of electric charges (ions or electrons) is curved due to the electric charges charged in the wiring material layer EL1 during the etching does not easily occur. Accordingly, in the embodiment, the lower-layer wiring (word line WL) disposed as a lower layer of the memory cell array layer is etched by the etching method in the related art.

Next, as illustrated in FIGS. 4A to 4F, an interlayer insulating film ILD2 such as a TEOS (tetraethoxysilane) film is embedded in the etched region, and the upper surface is planarized while removing the interlayer insulating film ILD2, which is formed upward from the upper electrode layer UE, by using a CMP (chemical mechanical polishing) method. Therefore, the interlayer insulating film ILD2 is embedded between the line-and-space shaped patterns, which are extending in the X direction of the memory cell array unit MCA and the word line hookup unit WHU, and in the bit line hookup unit BHU.

Next, as illustrated in FIGS. 5A to 5F, a wiring material layer EL2 is formed on the upper electrode layer UE and the interlayer insulating film ILD2.

Next, as illustrated in FIGS. 6A to 6F, the wiring material layer EL2, a stacked film including the upper electrode layer UE, the variable resistive layer RW, the lower electrode layer LE and the selector layer SL, and the interlayer insulating film ILD2 embedded between the stacked films are patterned in a line-and-space shape extending in the Y direction by drying etching by using a bit line pattern mask. Herein, the etching is performed until the bottom portion of the selector layer SL is separated from the adjacent selector layer SL adjacent in the X direction. Therefore, the memory cell array is formed so that the second-layered wiring material layer EL2 becomes a bit line BL, and the memory cells MC configured with a stacked film of the selector layer SL and the variable resistive element VR including the lower electrode layer LE, the variable resistive layer RW, and the upper electrode layer UE defined by the word line WL and the bit lines BL are arranged at each intersection portion of the word lines WL and the bit lines BL.

As illustrated in FIG. 6A, the bit lines BL are formed over the memory cell array unit MCA and the bit line hookup unit BHU. In the bit line hookup unit BHU, the bit lines BL are patterned so that the length of the bit line BL at the central portion in the X direction of the bit line hookup unit BHU is the longest, and the lengths of the bit lines BL are shortened moving toward both ends of the X direction of the bit line hookup unit BHU. In addition, in the bit line hookup unit BHU, the patterning is performed so that the end portion of the bit line BL in the Y direction is connected to the bit line contact BC, and the bit line contact BC is connected to the contact connection portion CC having a width larger than the width of the bit line BL. Therefore, in a region other that positions where the bit lines BL are formed, the stacked film from the wiring material layer EL2 to the selector layer SL and the interlayer insulating film ILD2 are removed.

In addition, in the embodiment, the patterning is performed so that, in the region of the memory cell array unit MCA opposite to the side of the bit line hookup unit BHU of the Y direction, dummy wirings DL are formed to connect the end portions of the bit lines BL arranged in a line-and-space shape.

In this manner, in the case where the patterning is performed in a shape of bit lines BL which are upper-layer wirings, at the initial stage of the etching, the wiring material layers EL2 are processed to be bit lines BL in a line-and-space shape extending in the Y direction, so that the wiring material layers EL2 are charged up during the etching. However, since the dummy wirings DL are provided so as to connect the one-side ends of the Y direction of the bit lines BL in a line-and-space shape, the bit lines BL are electrically connected to each other, so that the bit lines BL are in the same potential. In other words, even in the case where the bit lines BL are patterned so that the lengths in the Y direction are different, a difference in the charge-up amount does not easily occur between the bit lines.

In addition, even after the wiring material layer EL2 is processed, the underlying layers, that is, the stacked film including the upper electrode layer UE, the variable resistive layer RW, the lower electrode layer LE, and the selector layer SL, and the interlayer insulating film ILD2 needs to be continuously processed in a line-and-space shape. At this time, as described above, if a difference in the charge-up amount of the processed wiring material layer EL2, that is, the bit line BL occurs between the wirings, the trajectory of the incident particles is curved, so that dimensional defect occurs during the processing of the underlying layers of the bit line BL. However, in the embodiment, since the dummy wirings DL are provided, the potentials of the bit lines BL are substantially equalized after the processing during the etching. As a result, the incident particles during the drying etching are incident in the direction perpendicular to the surface of the substrate, and it is possible to suppress the problem in that the dimensional defect occurs in the side etching of the bit line BL caused by a curved trajectory of the incident particles or falling and short-circuit of the bit line BL occurs due to the side etching of the interlayer insulating film underlying the bit line BL.

Figure 7A:
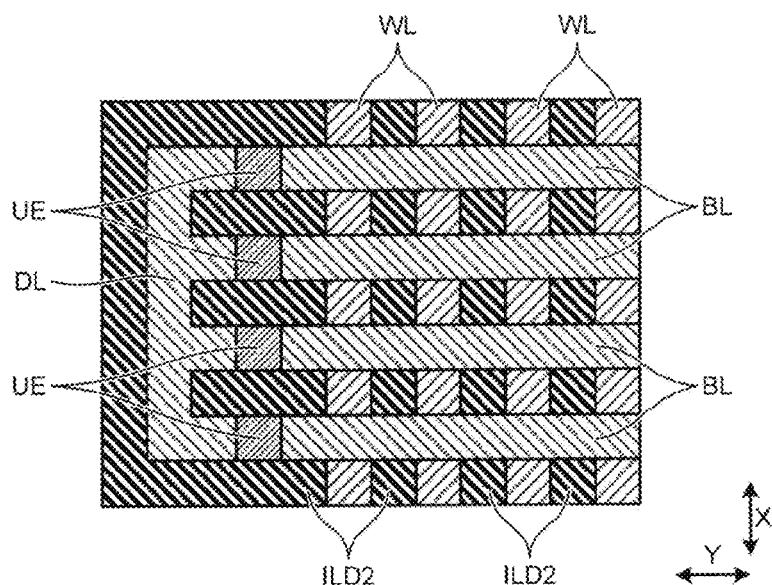
Figure 7B:
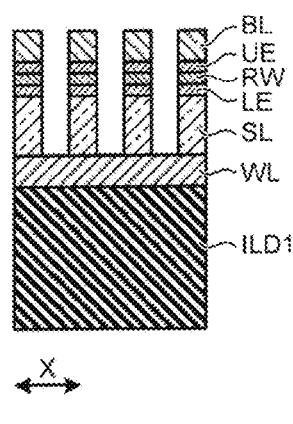
Figure 7C:
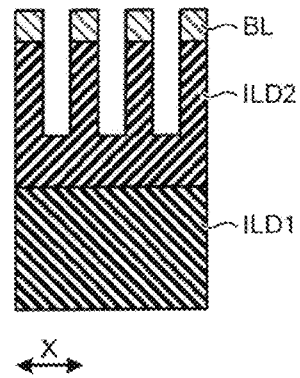
Figure 7D:
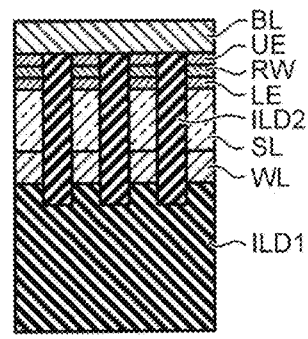
Figure 7E:
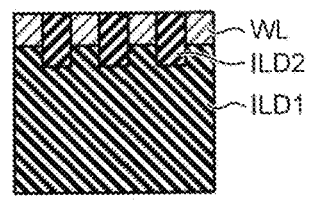
Figure 7F:
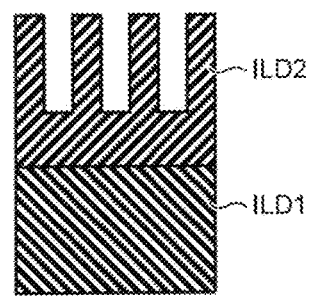
Figure 8A:
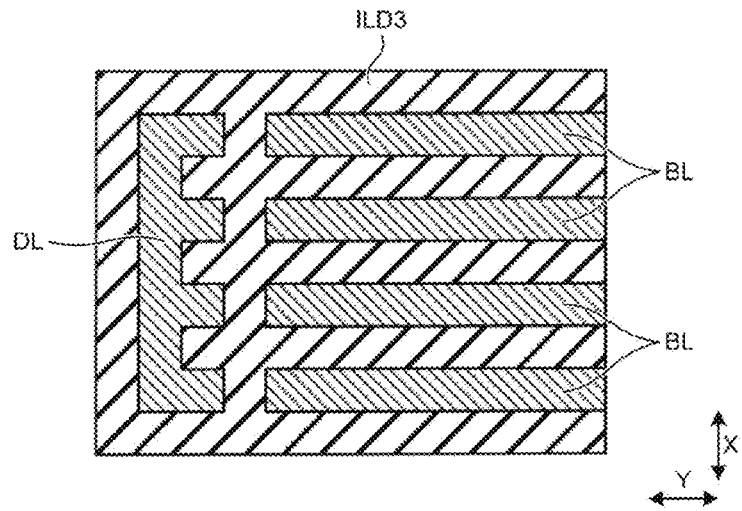
Figure 8B:
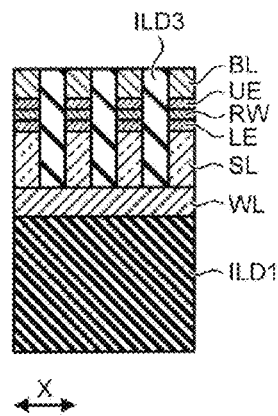
Figure 8C:
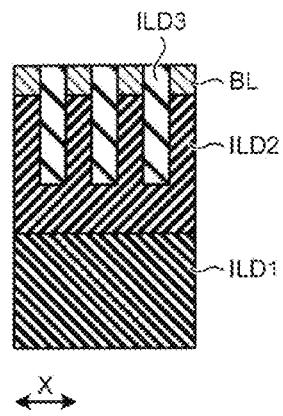
Figure 8D:
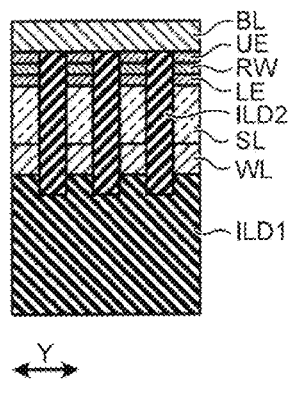
Figure 8E:
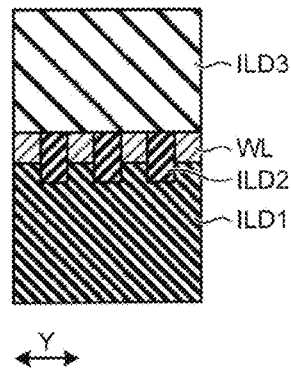
Figure 8F:
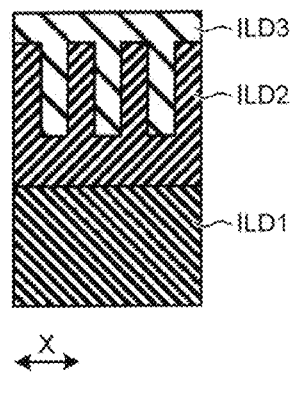

Next, as illustrated in FIGS. 7A to 7F, the pattern of the bit lines BL which are connected to each other by the dummy wirings DL outside the memory cell array unit MCA is separated by the drying etching by using a bit line cut mask. In FIG. 7F, although a portion of the bit line BL is removed so as to separate the dummy wiring DL and the bit line BL outside the memory cell array unit MCA, all the dummy wirings DL in the region of the side where the dummy wirings DL of the memory cell array unit MCA are formed may be removed.

Next, as illustrated in FIGS. 8A to 8F, an interlayer insulating film ILD3 such as a TEOS film is embedded in the etched region, the upper surface is planarized while removing the interlayer insulating film ILD3, which is formed upward from the bit line BL, by using a CMP method. Therefore, the interlayer insulating film ILD2 is embedded between the line-and-space shaped patterns, which are extending in the Y direction of the memory cell array unit MCA and the bit line hookup unit BHU, and in the word line hookup unit WHU.

Next, through-holes are formed in the interlayer insulating films ILD2 and ILD3 so as to be connected to the contact connection portions CC of the word line hookup unit WHU and the contact connection portions CC of the bit line hookup unit BHU. Next, by embedding a conductive material in the through-holes, the word line contacts WC and the bit line contacts BC are formed in the regions. In addition, the wiring layers are formed to connect the word line contacts WC and the bit line contact BC above the interlayer insulating film ILD3, so that the non-volatile memory device illustrated in FIGS. 1A and 1B is manufactured.

As a word line pattern mask used for patterning the above-described word line WL or a bit line pattern mask used for patterning the above-described bit line BL, appropriate mask materials may be used. For example, as the word line pattern mask or the bit line pattern mask, a line-and-space shaped resist pattern may be used. In addition, a hard mask such as a silicon oxide film and resist maybe formed on the processing object, and a line-and-space shaped pattern may be formed in the resist. After that, the line-and-space shaped pattern may be transferred to the hard mask, and the patterned hard mask may be used as a word line pattern mask or a bit line pattern mask.

In addition, a cap layer which is configured with a conductive material and functions as a stopper film during the embedding of the interlayer insulating film ILD2 may be disposed between the upper electrode layer UE and the upper-layer wiring (bit line BL). In this case, the cap layer is formed on the upper electrode layer UE by using the processes illustrated in FIGS. 2A to 2F.

In the above description, although the case where the variable resistance memory is configured with one-layered memory cell array layer is exemplified, the embodiment can be applied to a three-dimensional cross point type memory where a plurality of the memory cell array layers may be stacked and bit lines BL or word lines WL is shared by memory cell array layers adjacent in the lamination direction. In this case, the dummy wirings DL are disposed in the wirings which become the bit lines BL or the word lines WL except for the lowermost layer.

In the manufacturing method of this case, for example, after the processes of FIGS. 4A to 4E, the second-layered wiring material layer, the selector layer, the lower electrode layer, the variable resistive layer, and the upper electrode layer are sequentially stacked on the upper electrode layer UE and on the interlayer insulating film ILD2. Next, pattern is performed from the second-layered upper electrode layer to the first-layered selector layer SL in a line-and-space shape extending in a direction rotated by 90 degrees from the extension direction of the just-below wiring in the surface of the substrate, the interlayer insulating film is embedded in the patterned region. Next, from the processes illustrated in FIGS. 2A to 2F, the processes are repeated a predetermined number of times, so that a non-volatile memory device where an arbitrary number of the memory cell array layers are stacked can be manufactured.

FIG. 9 is a schematic top diagram illustrating another example of a configuration of a non-volatile memory device according to the embodiment. In the figure, in a non-volatile memory device where a plurality of memory cell array layers are stacked, lower-layer wirings (for example, word lines WL) and upper-layer wirings (for example, bit lines BL) of a memory cell array layer other than the lowermost memory cell array layer are patterned. As illustrated in this figure, the dummy wirings DL are disposed in the end portions of the bit lines BL as the upper-layer wirings as well as the end portions of the word lines WL as the lower-layer wirings. In addition, the lowermost memory cell array layer of the non-volatile memory device may have the above-described structure.

In addition, the layout of the bit line pattern mask or the bit line cut mask is not limited to the above-described example. Any one of layouts where wirings are electrically connected to each other during the cross point process may be used.

In the embodiment, in the case where the layer between the upper-layer wiring and the lower-layer wiring is dry-etched in a line-and-space shape together with the upper-layer wiring, the patterning is performed so that the one end of the upper-layer wirings in a line-and-space shape are connected to each other by the dummy wirings DL. Therefore, the charge-up amounts of the upper-layer wirings during the etching are substantially equalized. Accordingly, when the upper-layer wirings are processed and the layer between the upper-layer wiring and lower-layer wiring is further processed, a difference in the charge-up amount does not easily occur between the upper-layer wirings. As a result, it is possible to obtain an advantage in that the occurrence of production defect such as defect in a shape of a wiring due to a curved trajectory of the incident particles during the dry etching can be suppressed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of manufacturing a non-volatile memory device including a plurality of first wirings extending in a first direction, a plurality of second wirings extending in a second direction intersecting the first direction, and a non-volatile memory cell array layer where a plurality of non-volatile memory cells are arranged at intersection portions of the first wirings and the second wirings so as to be interposed, the method comprising:
sequentially stacking a first wiring material layer which is to be the first wiring and a memory-layer constituting layer constituting the plurality of non-volatile memory cells above a substrate;
performing dry etching so that the memory-layer constituting layer and the first wiring material layer are etched to form a first pattern having a first line-and-space pattern extending in the first direction in a memory cell formation region and a first wiring hookup region adjacent to the memory cell formation region in the first direction and so that the memory-layer constituting layer and the first wiring material layer are removed in a second wiring hookup region adjacent to the memory cell formation region in the second direction;
forming an interlayer insulating film to be embedded between line patterns constituting the first line-and-space pattern in the memory cell formation region and the first wiring hookup region, and forming the interlayer insulating film in a region which is removed by the dry etching in the second wiring hookup region;
forming a second wiring material layer which is to be the second wiring on the interlayer insulating film and the memory-layer constituting layer;
performing dry etching so that the second wiring material layer, the memory-layer constituting layer, and the interlayer insulating film are processed to form, in the memory cell formation region and the second wiring hookup region, a second pattern including a second line-and-space pattern extending in the second direction and a first dummy pattern, and so that the second wiring material layer and the memory-layer constituting layer are removed in the first wiring hookup region, the first dummy pattern being connected to all line patterns constituting the second line-and-space pattern; and
removing at least a portion of the first dummy pattern.

2. The method according to claim 1, wherein in the formation of the second pattern, the first dummy pattern is a pattern connecting line patterns constituting the second line-and-space pattern in a region of the memory cell formation region opposite to the side of the second wiring hookup region.

3. The method according to claim 1, wherein, in the formation of the second pattern, the line patterns constituting the second line-and-space pattern are patterned so that lengths of the line patterns in the second direction are different.

4. The method according to claim 1, wherein,
in the formation of the first pattern, the first pattern is formed in the memory cell formation region and the first wiring hookup region, the first pattern including a second dummy pattern in addition to the first line-and-space pattern, and the second dummy pattern being connected to all of the line patterns constituting the first line-and-space pattern, and
after the formation of the first pattern, the second dummy pattern is removed before the embedding of the interlayer insulating film.

5. The method according to claim 1, wherein
the memory-layer constituting layer includes a selector layer and a variable resistive layer, and
the variable resistive layer is a metal oxide film including at least one or more elements selected from a group including Si, Ti, Ta, Nb, Hf, Zr, W, Al, Ni, Co, Mn, Fe, Cu, and Mo, a carbon film, or a chalcogenide compound.

6. A method of manufacturing a non-volatile memory device including a plurality of first wirings extending in a first direction, a plurality of second wirings extending in a second direction intersecting the first direction, and a non-volatile memory cell array layer where a plurality of non-volatile memory cells are arranged at intersection portions of the first wirings and the second wirings so as to be interposed, the method comprising:
sequentially stacking a first wiring material layer which is to be the first wiring and a first memory-layer constituting layer constituting a first non-volatile memory cell above a substrate;
performing dry etching so that the first memory-layer constituting layer and the first wiring material layer are etched to form a first pattern having a first line-and-space pattern extending in the first direction in a memory cell formation region and a first wiring hookup region adjacent to the memory cell formation region in the first direction of the and so that the first memory-layer constituting layer and the first wiring material layer are removed in a second wiring hookup region adjacent to the memory cell formation region in the second direction;
forming a first interlayer insulating film to be embedded between line patterns constituting the first line-and-space pattern in the memory cell formation region and the first wiring hookup region, and forming the first interlayer insulating film in a region which is removed by the dry etching in the second wiring hookup region;
sequentially stacking, on the first interlayer insulating film and the first memory-layer constituting layer, a second wiring material layer which is to be the second wiring and a second memory-layer constituting layer constituting a second non-volatile memory cell;
performing dry etching so that the second memory-layer constituting layer, the second wiring material layer, the first memory-layer constituting layer, and the first interlayer insulating film are processed to form, in the memory cell formation region and the second wiring hookup region, a second pattern including a second line-and-space pattern extending in the second direction and a first dummy pattern, and so that the second memory-layer constituting layer, the second wiring material layer, the first memory-layer constituting layer, and the first interlayer insulating film are removed in the first wiring hookup region, the first dummy pattern being connected to all line patterns constituting the second line-and-space pattern; and
removing at least a portion of the first dummy pattern.

7. The method according to claim 6, wherein in the formation of the second pattern, the first dummy pattern is a pattern connecting line patterns constituting the second line-and-space pattern in a region of the memory cell formation region opposite to the side of the second wiring hookup region.

8. The method according to claim 6, wherein, in the formation of the second pattern, the line patterns constituting the second line-and-space pattern are patterned so that lengths of the line patterns in the second direction are different.

9. The method according to claim 6, wherein,
in the formation of the first pattern, the first pattern is formed in the memory cell formation region and the first wiring hookup region, the first pattern including a second dummy pattern in addition to the first line-and-space pattern, and the second dummy pattern being connected to all of the line patterns constituting the first line-and-space pattern, and after the formation of the first pattern, the second dummy pattern is removed before the embedding of the first interlayer insulating film.

10. The method according to claim 6, wherein each of the first and second memory-layer constituting layers includes a selector layer and a variable resistive layer, and the variable resistive layer is a metal oxide film including at least one or more elements selected from a group including Si, Ti, Ta, Nb, Hf, Zr, W, Al, Ni, Co, Mn, Fe, Cu, and Mo, a carbon film, or a chalcogenide compound.

11. The method according to claim 6, further comprising:

forming, after the removing of the first dummy pattern, a second interlayer insulating film so as to be embedded between the line patterns constituting the second line-and-space pattern in the memory cell formation region and the second wiring hookup region, and forming the second interlayer insulating film in a region which is removed by the dry etching in the first wiring hookup region;

sequentially stacking a third wiring material layer which is to be the first wiring and a third memory-layer constituting layer constituting a third non-volatile memory cell on the second interlayer insulating film and the second memory-layer constituting layer;

performing dry etching so that the third memory-layer constituting layer, the third wiring material layer, the second memory-layer constituting layer, and the second interlayer insulating film are processed to form, in the memory cell formation region and the first wiring hookup region, a third pattern including a third line-and-space pattern extending in the first direction and a third dummy pattern, and so that the third memory-layer constituting layer, the second wiring material layer, the second memory-layer constituting layer, and the second interlayer insulating film are removed in the second wiring hookup region, the third dummy pattern being connected to all line patterns constituting the third line-and-space pattern; and removing at least a portion of the third dummy pattern.

12. The method according to claim 11, wherein in the formation of the third pattern, the third dummy pattern is a pattern connecting line patterns constituting the third line-and-space pattern in a region of the memory cell formation region opposite to the side of the first wiring hookup region.

13. The method according to claim 11, wherein the third memory cell-layer constituting layer includes a selector layer and a variable resistive layer, and the variable resistive layer is a metal oxide film including at least one or more elements selected from a group including Si, Ti, Ta, Nb, Hf, Zr, W, Al, Ni, Co, Mn, Fe, Cu, and Mo, a carbon film, or a chalcogenide compound.

* * * * *